(12) United States Patent
Peng

(10) Patent No.: US 7,078,070 B2
(45) Date of Patent: Jul. 18, 2006

(54) METHOD FOR FABRICATING AN ORGANIC LIGHT EMITTING DIODE

(75) Inventor: Kuang-Chung Peng, Taipei (TW)

(73) Assignee: Helix Technology Inc., Hsinchu (TW)

( * ) Notice: Subject to any disclaimer, the term of this patent is extended or adjusted under 35 U.S.C. 154(b) by 357 days.

(21) Appl. No.: 10/206,716

(22) Filed: Jul. 26, 2002

(65) Prior Publication Data

US 2002/0176930 A1 Nov. 28, 2002

Related U.S. Application Data

(62) Division of application No. 09/761,925, filed on Jan. 17, 2001, now Pat. No. 6,495,198.

(30) Foreign Application Priority Data

Nov. 7, 2000 (TW) ........................................ 89123456 A

(51) Int. Cl.
- *B05D 5/12* (2006.01)
- *C23C 14/22* (2006.01)
- *C23C 14/34* (2006.01)
- *C23C 14/50* (2006.01)

(52) U.S. Cl. .................... 427/66; 427/255.5; 204/192.1
(58) Field of Classification Search ................ 427/66, 427/255.11, 255.14, 255.15, 255.19, 255.23, 427/255.5, 255.6, 255.7; 204/192.1; 313/504
See application file for complete search history.

(56) References Cited

U.S. PATENT DOCUMENTS 5,925,980 A * 7/1999 So et al. ..................... 313/504

* cited by examiner

*Primary Examiner*—Shrive P. Beck
*Assistant Examiner*—Michael Cleveland
(74) *Attorney, Agent, or Firm*—J.C. Patents

(57) ABSTRACT

A method for fabricating an organic light emitting diode. The method forms an anode, an organic emitting layer and a cathode sequentially on a substrate. When the interface between the anode and the organic emitting layer is forming, the depositional rate of the anode on the substrate is decreasing and the deposition rate of the organic emitting layer on the substrate is increasing. When the interface between the organic emitting layer and the cathode is forming, the deposition rate of the organic emitting layer on the substrate is decreasing, and the deposition rate of the cathode on the substrate is increasing. This method can form a hazy heterojunction between the anode, the organic emitting layer and the cathode, thus forming an organic light emitting diode with a hazy heterojunction.

11 Claims, 6 Drawing Sheets

(2 of 6 Drawing Sheet(s) Filed in Color)

US 7,078,070 B2

METHOD FOR FABRICATING AN ORGANIC LIGHT EMITTING DIODE

CROSS-REFERENCE TO RELATED APPLICATION

This application is a divisional application of, and claims the priority benefit of, U.S. application Ser. No. 09/761,925, filed Jan. 17, 2001, now U.S. Pat. No. 6,495,198.

BACKGROUND OF THE INVENTION

1. Field of Invention

The invention relates to a method for fabricating an organic light emitting diode, and more specifically, to a method for fabricating an organic light emitting diode with a hazy heterojunction.

2. Description of Related Art

An organic light emitting diode converts electric energy into light energy, and a semiconductor device has the maximum conversion efficiency. An organic light emitting diode often is applied in an indicator, a screen display and an emitting device of an optical pick-up head, etc. The organic light emitting diode device has some characteristics, such as non-visual angle, simple production, lower cost, high response speed, a broad range in temperature and full-colour, etc. It fits with the requirements for a multimedia monitor and has become the hottest research topic.

A basic structure of the organic light emitting diode includes a glass substrate, a metal electrode, an indium-tin-oxide (ITO) electrode and an organic emitting layer. In the emitting principle of the organic light emitting diode, the metal electrode is a cathode and the indium-tin-oxide is an anode. When the forward bias is charging on the two electrodes, an electron and a hole are respectively injected from the metal electrode and the ITO electrode into the emitting layer. When two carriers meet in the emitting layer and produce a photon by a radioactive recombination and a light emitting phenomena is achieved. In addition, the conduction speed of the electron is faster than the conduction speed of the hole. In order to achieve a conductive balance parameter of 1 between the electron and the hole, a hole injection layer (HIL) and a hole transport layer (HTL) are formed between the indium-tin-oxide electrode and the emitting layer. An electron injection layer (EIL) and an electron transport layer (ETL) are formed between the emitting layer and the metal electrode. The carriers thus can achieve a balance of the electron and the hole injection/transportation between the difference materials.

FIGS. 1A through 1B are cross-sectional views of a conventional organic light emitting diode and illustrate the steps for fabricating a conventional organic light emitting diode. Referring to FIG. 1A, the substrate 100 is a glass material, and an anode 101 of indium tin oxide material is formed. Then the organic emitting layer 106 builds on the top of the anode 101, and the metal material of cathode 110 is formed over the organic emitting layer 106. When a forward bias charges on the two electrodes, the electron and the hole are injected respectively from anode 101 and cathode 110 into the organic emitting layer 106. The two carriers collide in the emitting layer 106 and emit a photon by radioactive recombination. Further referring to FIG. 1B, the conduction speed of the electron is faster than the conduction speed of the hole. Therefore, there are many methods for fabricating an organic light emitting diode, such as adding an electron injection layer 108, a hole injection layer 102 and a hole transport layer 104, etc. The heterojunction is utilized to get a conduction balance between the electron and the hole.

SUMMARY OF THE INVENTION

Accordingly, the invention provides a method for fabricating an organic light emitting diode to haze the heterojunction and increase the efficiency of the radioactive recombination of the electron and the hole.

As embodied and broadly described herein, the invention provides a substrate, such as a glass or plastic substrate. An anode, an organic emitting layer and a cathode are formed sequentially on the substrate by an evaporation or a sputtering deposition method. The material of the anode is indium-tin-oxide, and the material of the organic emitting layer is Alq3. The material of the cathode is aluminum, silver or any metal with good conductivity. When forming the interface between the cathode and the organic emitting layer, the deposition rate of the anode material on the substrate gradually decreases, and the deposition rate of the organic emitting material on the substrate gradually increases. When forming the interface between the organic emitting layer and the cathode, the deposition rate of the organic emitting material on the substrate gradually decreases, and the deposition rate of the cathode material on the substrate gradually increases. Therefore, the gradient concentration is distributed between each layer of the anode, the organic emitting layer and the cathode. The heterojunction between each layer becomes blurred, thus creating an organic light emitting diode with a hazy heterojunction.

It is to be understood that both the foregoing general description and the following detailed description are exemplary, and are intended to provide further explanation of the invention as claimed.

BRIEF DESCRIPTION OF THE DRAWINGS

The file of this patent contains at least one drawing executed in color. Copies of this patent with color drawing (s) will be provided by the Patent and Trademark Office upon request and payment of the necessary fee. The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1B:
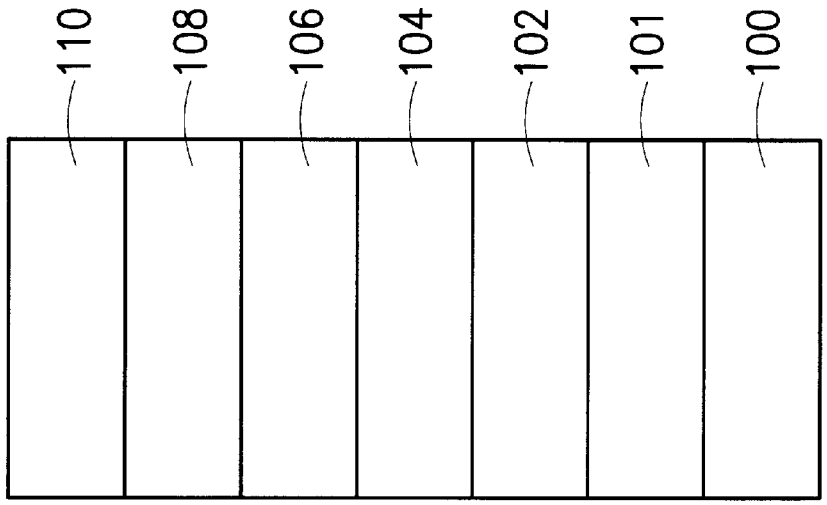
FIG. 1A through FIG. 1B are cross-sectional views of a conventional organic light emitting diode.
Figure 1A:
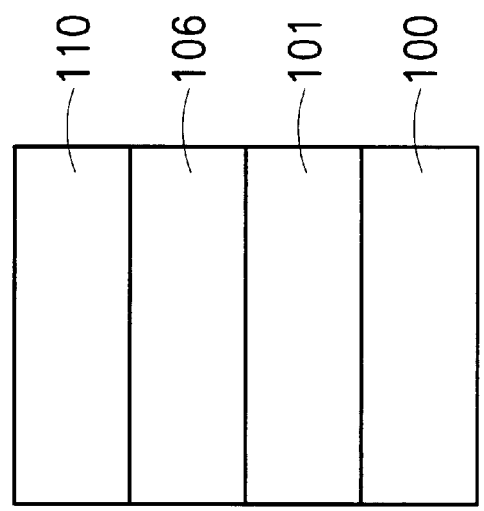
Figure 2A:
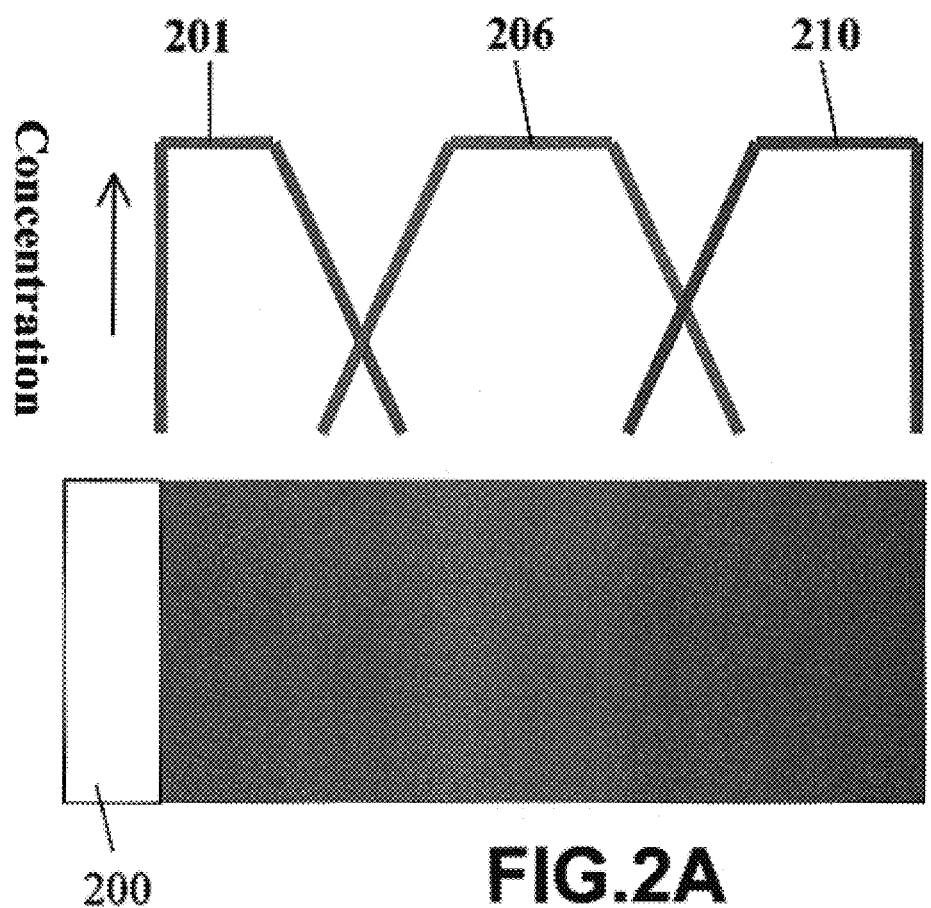
FIG. 2A through FIG. 2B are cross-sectional views illustrating the steps of the fabrication method of a preferred embodiment of the organic light emitting diode.
Figure 2B:
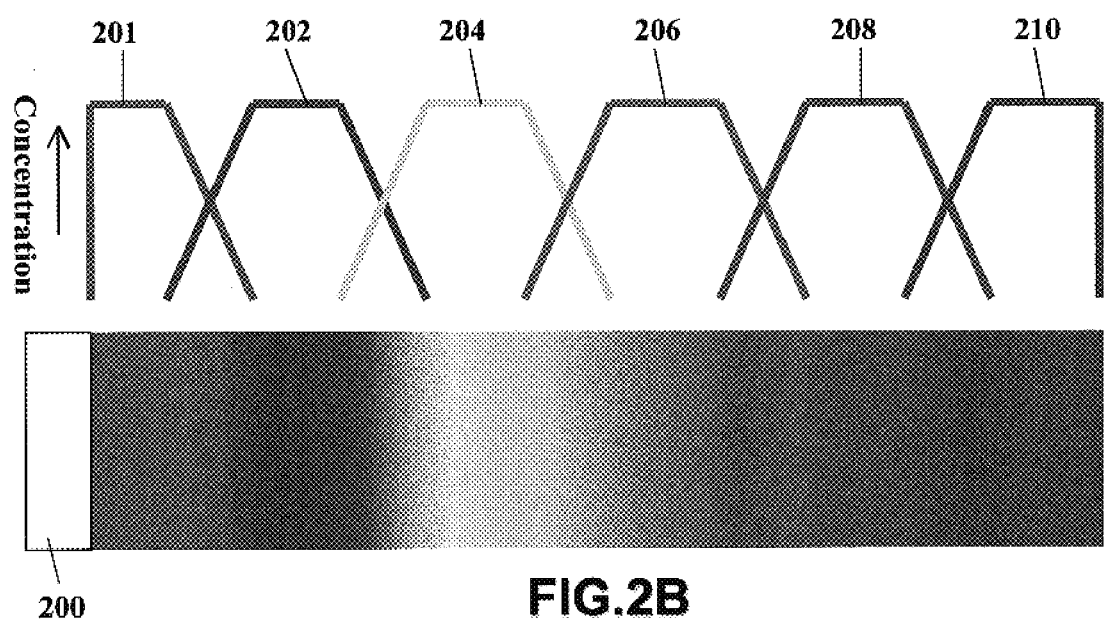

Accordingly, FIG. 2A through FIG. 2B are the cross-sectional views of a preferred embodiment of the organic light emitting diode of the invention.

Referring to FIG. 2A, an organic light emitting diode of three layers is utilized, and the concentration in each layer is distributed by the gradient concentration and blurred in each heterojunction. Firstly, an anode 201 is formed on the substrate 200 by either an evaporation method or a sputtering deposition method. When the anode 201 is formed to a desired thickness, the deposition rate of the anode material gradually decreases, and the deposition rate of the organic emitting layer 206 material gradually increases to gradually form the organic emitting layer 206. Afterwards, the organic emitting layer 206 is sustained at an optimum deposition rate. Then, when the organic emitting layer 206 is formed to a desired thickness, the deposition rate of the organic emitting layer 206 material gradually decreases, and the deposition rate of the cathode 210 material gradually increases to gradually form the cathode 210. The cathode 210 then is sustained at the optimum deposition rate until the cathode 210 is formed to a desired thickness. The fabrication of a three layer structure of an organic light emitting diode is thus completed.

Referring to FIG. 2B, in order to balance the conductivity between the electron and the hole, the organic light emitting diode can have more than 3 layers in the structure, and the gradient concentration of each layer is distributed so that the heterojunction for each layer is blurred. For example, an anode 201, a hole injection layer 202, a hole transport layer 204, an organic emitting layer 206, an electron injection layer 208 and a cathode 210 are formed on the substrate 200. When each layer is formed to a desired thickness, the deposition rate of its depositional source gradually decreases, and the deposition rate of the next depositional source gradually increases. The gradient concentration is distributed and the heterojunction is blurred between two layers. The physical properties and the conductivity of the organic light emitting diode is thus improved.

Figure 3A:
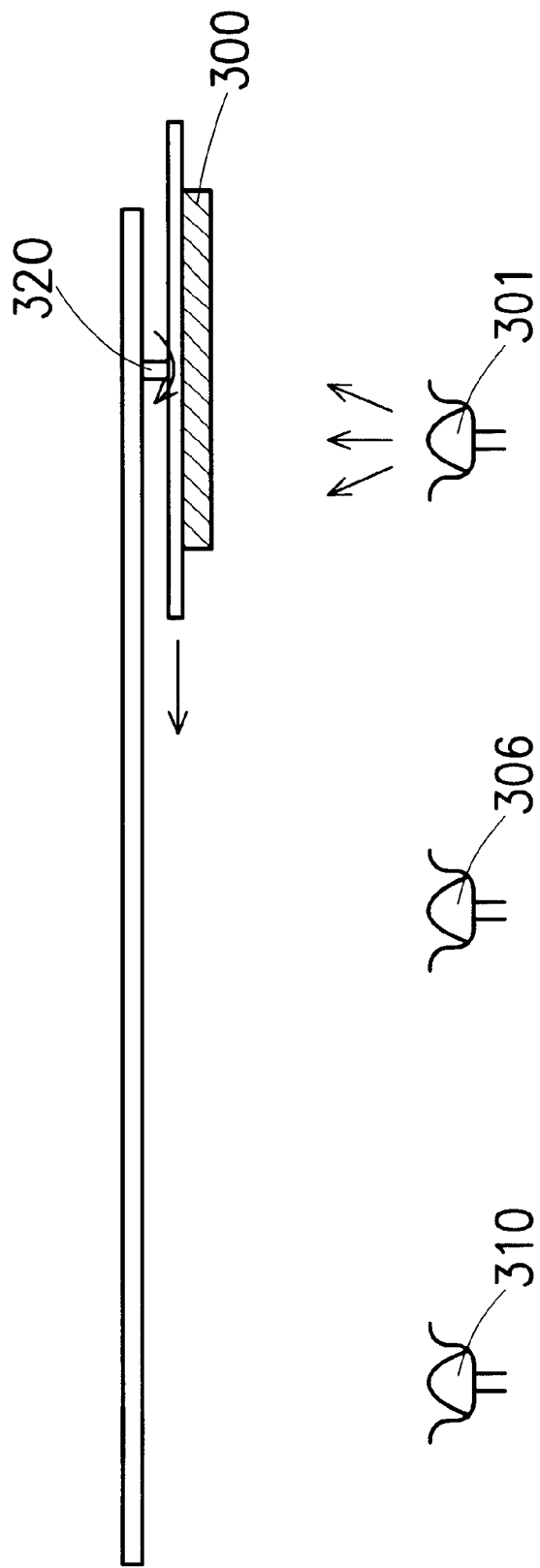
FIG. 3A through FIG. 3B illustrate the steps in a fabricating method of an organic light emitting diode.
Figure 3B:
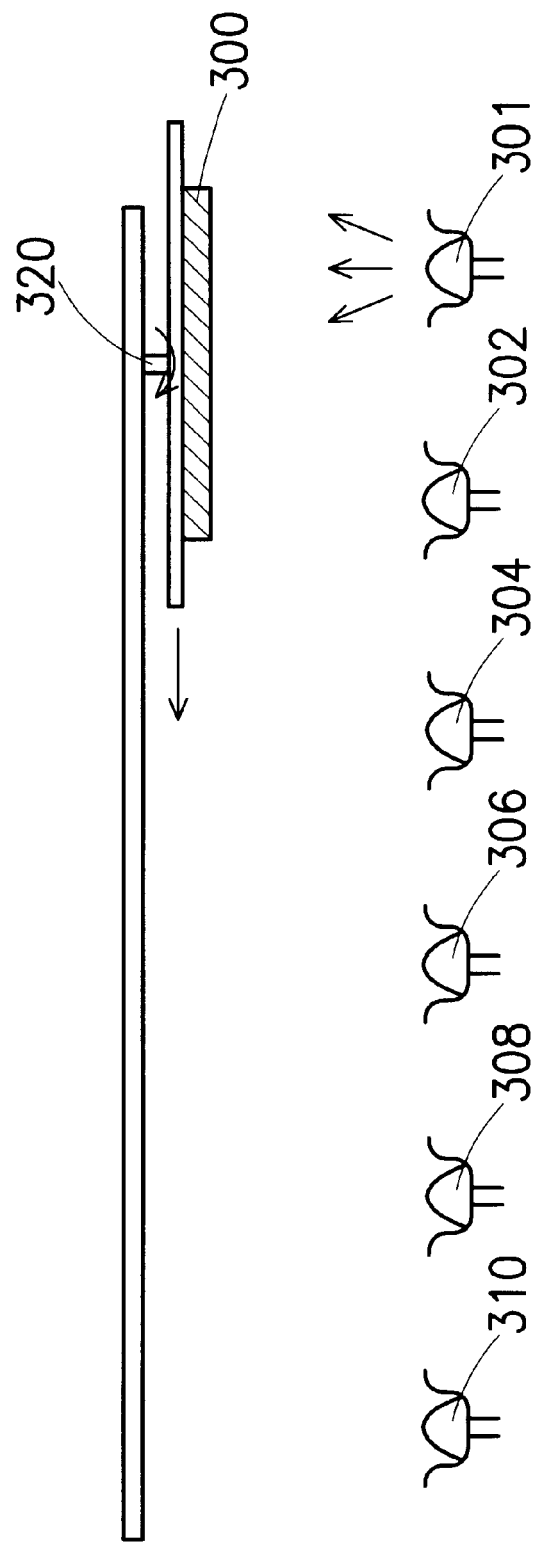

FIG. 3A through FIG. 3B illustrate a preferred embodiment of the organic light emitting diode according to a fabrication method of the present invention.

Referring to FIG. 3A, the method provides three depositional sources, and the three depositional sources are lined up in order. There is an anode depositional source 301, an organic emitting layer depositional source 306 and a cathode depositional source 310. A material of the substrate 300 is either the transparent glass or plastic. The substrate 300 is fixed by a fixture 320 and is placed over and parallel to the three depositional sources. The substrate 300 is rotated at a constant speed and moves in a level direction while continuing its constant rotation. The substrate 300 maintains a constant rotating speed over the anode depositional source 301 and forms an anode layer. When the anode layer is formed to a desired thickness, the substrate 300 moves slowly away from the anode depositional source 301 and the deposition rate of the depositional source 301 decreases gradually. When the substrate 300 is closer to the organic emitting layer depositional source 306, the organic emitting layer starts to deposit a layer. When the organic emitting layer depositional source 306 forms an organic emitting layer to a desired thickness, the substrate 300 moves slowly toward the cathode depositional source 310. Similarly, as the substrate 300 moves away from a previous source with a decreasing deposition rate, the deposition rate of the next source is increasing to deposit a layer. When the cathode source 310 forms a layer to a desired thickness, the fabrication of the organic light emitting diode is completed. In this three layer structure of the organic light emitting diode, the heterojunction of each layer is blurred, and the gradient concentration is distributed to form an organic light emitting diode with a hazy heterojunction.

Referring to FIG. 3B, the substrate 300 moves in a parallel direction to form the organic light emitting diode and blur the boundary of the heterojunction between two layers. This method can use more than three depositional sources on the substrate. There is an anode depositional source 301, a hole injection layer depositional source 302, a hole transport layer depositional source 304, an organic emitting layer depositional source 306, an electron injection layer depositional source 308 and a cathode depositional source 310, and they all line up in a straight line. The substrate 300 is fixed over the depositional sources and rotates at a constant speed. The substrate 300 moves slowly toward the anode depositional source 301, and the anode layer is formed. When the anode layer is deposited to a desired thickness, the substrate 300 then moves slowly toward the hole injection layer depositional source 302. The other layers are formed using a similar method, finally forming an organic light emitting diode structure with more than three layers and a hazy heterojunction between the layers.

In the foregoing description, when forming the interface between each layer of an organic light emitting diode with three or more layers, as the material deposition rate of one layer gradually decreases, the material deposition rate of the next layer increases. As a result, the gradient concentration for each layer is distributed, and an organic light emitting diode with three or more layers and a hazy heterojunction is thus formed.

Figure 4:
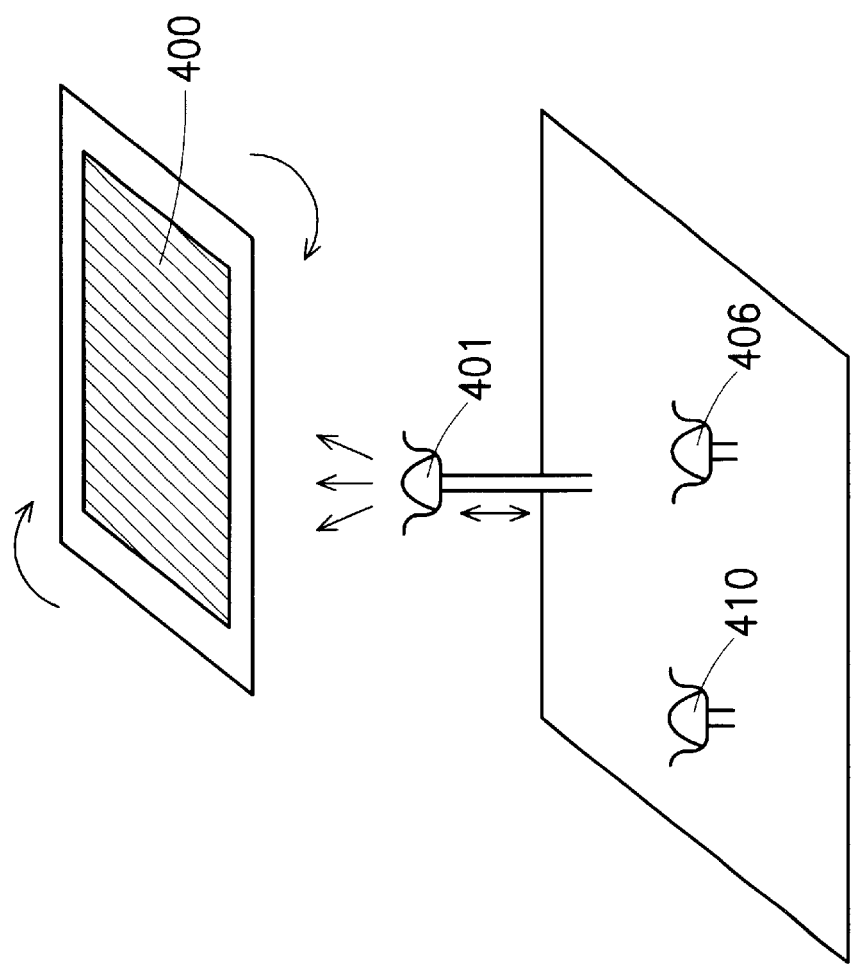
FIG. 4 illustrates the steps of a fabrication method in another preferred embodiment of the invention.

FIG. 4 illustrates a preferred embodiment of the organic light emitting diode of the invention.

Referring to FIG. 4, there are three depositional sources and they distribute evenly in a depositional chamber. There is an anode depositional source 401, an organic emitting layer depositional source 406 and a cathode depositional source 410. All three depositional sources can move in a vertical direction and change the deposition rate when depositing. The material of the substrate 400 is either transparent glass or plastic. The substrate 400 is fixed over the three depositional sources and maintains a constant rotational speed. Firstly, the anode depositional source 401 moves up and closer to the substrate 400. Then, after the anode layer is formed on the substrate 400, the anode depositional source 401 moves back down. As the anode depositional source 401 is moving down, the organic emitting layer depositional source 406 is moving up. During this procedure, the heterojunction between two layers can be blurred. Similarly, when the organic emitting layer depositional source 406 is moving down, then the cathode depositional source 410 is moving up to blur the heterojunction. When the cathode layer is formed to a desired thickness, the three layers of the organic light emitting diode are completed and the heterojunction between the layers is blurred.

This depositional source vertical shifting method fabricates an organic light emitting diode and blurs the heterojunction between each layer.

In this method for fabricating an organic light emitting diode, the depositional source moves up and down vertically and forms a blurred heterojunction between two layers. This method can also incorporate more then three depositional sources and form a structure that has more than three layers on the organic light emitting diode. Other depositional sources can include an anode depositional source, a hole injection layer depositional source, a hole transport layer depositional source, an organic emitting layer depositional source, an electron injecting layer depositional source and a cathode depositional source. These depositional sources are distributed evenly on the bottom of the depositional chamber. The substrate is fixed over the depositional sources and rotates at a constant speed. When each depositional source moves up sequentially one at a time, a layer is formed on the substrate to a desired thickness. When a depositional source moves down slowly, the next depositional source moves up slowly at the same time. Therefore, a blurred heterojunction will be formed between each layer. This method can improve the physical characteristics and the conductivity.

The depositional source moving vertically is controlled by a depositional rate. It utilizes the relation between the vertical acceleration and the depositional rate and controls the depositional rate on the substrate. Assuming that the distance between the depositional source and the substrate is L, the relation is:

Depostional Rate $$\text{Depostional Rate} \propto \left[\frac{1}{L}\right]^2$$

Because acceleration modifies the depositional rate of the depositional source on the substrate, the relation between L and the depositional rate is:

Depositional Rate $$\text{Depositional Rate} \propto \left[\frac{1}{L}\right]$$

Therefore, by controlling the vertical acceleration of the depositional source, the deposit can be controlled to form the desired degree of blurriness of the heterojunction.

In the foregoing description two special devices form an organic light emitting diode and blur the heterojunction between the layers, and a multi-layer structure of the organic light emitting diode is also formed. This method improves the conventional technique in which the heterojunction between the layers is very clear and the physical characteristics and conductivity are poor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating an organic light emitting diode, comprising:

providing a substrate;

providing a fixture that is fixed on the substrate over a plurality of depositional sources that can move vertically up and down, including an anode depositional source, an organic emitting layer depositional source and a cathode depositional source, wherein the depositional sources evenly distribute to the substrate moving the anode depositional source up and closer to the substrate to form the anode on the substrate;

moving the anode depositional source down before the anode depositional source completes the anode, and moving the organic emitting layer depositional source up slowly to form an organic emitting layer;

moving the organic emitting layer depositional source down before the organic emitting layer depositional source completes the organic emitting layer, and moving the cathode depositional source up slowly to form a cathode, wherein heterojunctions between the anode and the organic emitting layer and the cathode and the organic emitting layer are blurred.

2. The method as claimed in claim 1, wherein the anode, the organic emitting layer and the cathode are formed on the substrate by evaporation.

3. The method as claimed in claim 1, wherein the anode, the organic emitting layer and the cathode are formed on the substrate by sputtering deposition.

4. The method as claimed in claim 1, wherein a hole injection layer, a hole transport layer and an electron transport layer are formed in between the anode and the cathode.

5. The method as claimed in claim 4, wherein the material of the electron transport layer is a combination of Alq3 and a metal indium by the ratio of 1:1.

6. The method as claimed in claim 1, wherein the organic emitting layer depositional source includes a hole injection layer depositional source, a hole transport layer depositional source and an electron transport layer depositional source.

7. The method as claimed in claim 1, wherein the material of the substrate is a transparent glass material.

8. The method as claimed in claim 1, wherein the material of the substrate is a transparent plastic material.

9. The method as claimed in claim 1, wherein the material of the anode is an indium-tin-oxide (ITO).

10. The method as claimed in claim 1, wherein the material of the organic emitting layer is Alq3.

11. The method as claimed in claim 1 wherein the material of the cathode is aluminum, silver, or a metal material with sufficient conductivity to act as a cathode.

* * * * *